US005863455A

United States Patent [19]

Segal

[11] Patent Number: 5,863,455

[45] Date of Patent: Jan. 26, 1999

[54] COLLOIDAL INSULATING AND COOLING FLUID

[75] Inventor: Vladimir Segal, Livingston, N.J.

[73] Assignee: ABB Power T&D Company Inc., Raleigh, N.C.

[21] Appl. No.: 892,054

[22] Filed: Jul. 14, 1997

[51] Int. Cl.[6] .............................. H01F 1/44; H05K 5/00; F25B 21/00; B01J 13/00

[52] U.S. Cl. .............................. 252/62.52; 252/62.54; 252/62.51 R; 252/308; 252/309; 252/311; 252/313.1; 62/3.1; 361/699; 361/698

[58] Field of Search .............................. 252/62.52, 62.54, 252/62.51 R, 308, 309, 311, 313.1; 62/3.1; 361/699, 698

[56] References Cited

U.S. PATENT DOCUMENTS

| | | | |
|---|---|---|---|
| 3,215,572 | 11/1965 | Papell | 149/2 |
| 3,301,790 | 1/1967 | Fitch et al. | 252/308 |
| 3,635,819 | 1/1972 | Kaiser | 252/62.52 |
| 3,843,540 | 10/1974 | Reimers et al. | 252/62.52 |
| 3,917,538 | 11/1975 | Rosenweig | 252/62.51 |
| 4,094,804 | 6/1978 | Shimoiizaka | 252/62.52 |
| 4,356,098 | 10/1982 | Chagnon | 252/62.51 |
| 4,506,895 | 3/1985 | Raj | 277/1 |
| 4,523,967 | 6/1985 | Cartwright | 149/2 |
| 4,732,706 | 3/1988 | Borduz et al. | 252/510 |
| 4,992,190 | 2/1991 | Shtarkman | 252/62.52 |
| 5,188,764 | 2/1993 | Shimizu et al. | 252/308 |
| 5,382,373 | 1/1995 | Carlson et al. | 252/62.55 |
| 5,462,685 | 10/1995 | Raj et al. | 252/62.52 |

OTHER PUBLICATIONS

Publication entitled, “Transformation” (for employees of the ABB Power Transformer Division): Issue 3, Jan. 29, 1990; Issue 7, Mar. 26, 1990, Issue 11, May 21, 1990; Issue 12, Jun. 4, 1990, Issue 13, Jun. 13, 1990; Issue 14, Jul. 2, 1990, Issue 15, Jul. 16, 1990; Issue 24, Nov. 19, 1990, Issue 25, Dec. 3, 1990; Issue 32, Mar. 11, 1991, Issue 34, Apr. 8, 1991.

B. Berkovsky and V. Bashtovoy, Eds., *Magnetic Fluids and Applications Handbook*, Begall Publishing House, New York, New York (1996), no month.

*Primary Examiner*—Melissa Bonner

*Attorney, Agent, or Firm*—Woodcock Washburn Kurtz Mackiewicz & Norris LLP

[57] ABSTRACT

Colloidal fluids having improved insulating and/or cooling properties. Embodiments of the invention involve colloidal fluids which comprise a carrier liquid and a dispersed phase of non-metallic particles, wherein the colloidal fluid has a saturation magnetization of less than about 50 Gauss. The compositions may be employed to insulate and/or cool electromagnetic devices, including high power devices, such as power transformers.

25 Claims, 1 Drawing Sheet

COLLOIDAL INSULATING AND COOLING FLUID

FIELD OF THE INVENTION

The present invention relates to novel colloidal fluids. More particularly, the present invention relates to novel colloidal fluids and their use for insulating and/or cooling electromagnetic devices.

BACKGROUND OF THE INVENTION

Liquid insulation in an electromagnetic device, such as a power transformer, is subject to different types of voltages: AC voltages having a wide range of amplitudes and frequencies, and impulse (essentially, short-lived DC) voltages of even higher amplitude. The ability of liquid insulation to withstand the stresses imposed by electric fields of a particular voltage is often the most important property of such an insulation. This determines whether a particular liquid can be used as an insulation in a transformer (or any other electromagnetic device where high voltage is employed) of a given voltage rating. The selection of an insulation is important in that it can determine the design of all of the main elements of the device.

Typically, the highest voltage stressing the liquid insulation is the impulse (lightning) voltage. When the volume of liquid insulation is subjected to a critical dielectric stress produced by rising to its peak value impulse voltage, an insulation breakdown may occur.

To maximize the efficiency of electrical energy transmission and distribution, it is often necessary to utilize high current densities and high AC voltages inside the electromagnetic device. High currents lead to increased heat generation, while high voltage increases the level of electric stress applied to the insulation components of an electromagnetic device. Increased heat generation limits the maximum current which can be safely carried by the conductive elements of an electromagnetic device, and also increases the costs associated with the transmission, distribution, and final use of electrical energy due to the increased need for conductive materials. This also results in an overall increase in the weight and size of a given electromagnetic device. High electric stress also limits the voltage drop per unit of space inside an electromagnetic device, thereby leading to increased costs associated with the transfer of energy from generation point to the final user. Moreover, to compensate for higher stress, it is often necessary to increase the space between winding turns filled with insulation liquid, such as transformer oil, thereby further increasing transformer dimensions and cost.

Since electric current generates both heat and electric stress, it is important that the electric insulation performs two different functions continuously: (a) prevents current flow between different conductive components having different voltages; and (b) transfers heat from the windings and magnetic core to the outer walls of the device to be cooled. The dielectric properties of the liquid insulation are the most critical ones, for they are responsible for the functioning of a high voltage electromagnetic device, and dielectric strength of an insulation liquid cannot be compromised. As a result, practically all prior art liquid insulation systems have substantially high dielectric strength, low electric conductivity and high levels of purity; it is believed that this latter property is necessary for desirable dielectric strength. However, liquid insulation systems of the prior art also possess low heat conductivity, which prevents efficient heat transfer via conduction. Instead, electromagnetic devices generally employ Archimedes convection which results from the expansion of liquid insulation, e.g., transformer oil, upon heating to elevated temperatures so an Archimedes force develops which lifts the hot (and less dense) oil up and pushes the cold (more dense) oil down. Thus, thermal convection is established and heat transfer becomes possible from the windings to the outer wall of an electromagnetic device. This type of heat transfer, however, has relatively low efficiency and requires that there be provided special paths (ducts) inside the windings and the magnetic core so that the oil can flow through the hottest inner sections of the parts of the device which generate heat. Relying on heat transfer through the rather inefficient mechanism of Archimedes convection leads to an increase in the size of the device as well as an increase in cost by lowering the amount of conductive or magnetic material per unit volume. Moreover, even if the necessary precautions have been taken to ensure heat transfer, so-called hot spots can develop inside the windings/magnetic core assembly which further limits the voltage and current.

Prior art liquid insulation systems perform their functions within a limited range of current, voltage, and environmental conditions which define the power rating of an electromagnetic device. There is a need to expand these limits so that high power, i.e., higher voltage or current, can be transmitted via the device without compromising its safety and reliability, or so that the same power can be transmitted but with a smaller and less costly device. The present invention is directed to this, as well as other important ends.

SUMMARY OF THE INVENTION

The present invention relates, in part, to colloidal fluids. Specifically, in one embodiment, the invention relates to a stable, colloidal fluid comprising (a) about 99.99 to about 98% by volume of a carrier liquid, and (b) from about 0.01 to about 2% by volume of non-metallic particles, wherein the colloidal fluid has a saturation magnetization of less than about 50 Gauss.

Another embodiment of the invention relates to a stable, colloidal fluid which comprises (a) a carrier liquid, and (b) non-metallic particles, wherein the colloidal fluid has a saturation magnetization of less than about 50 Gauss.

Still another embodiment of the invention relates to a method for preparing a colloidal fluid having a saturation magnetization of less than about 50 Gauss. The method comprises (a) providing a carrier liquid, and (b) combining non-metallic particles with the carrier liquid.

Yet another embodiment of the invention relates to an electromagnetic device. The device comprises (a) means for producing an electromagnetic field and heat, and (b) a stable, colloidal fluid which is in contact with the device. The colloidal fluid comprises (i) a carrier liquid, and (ii) non-metallic particles, wherein the colloidal fluid has a saturation magnetization of less than about 50 Gauss.

Still another embodiment of the invention relates to a method of insulating and cooling an electromagnetic device which produces an external magnetic field and heat. The method comprises contacting the device with a stable, colloidal fluid comprising (a) a carrier liquid, and (b) non-metallic particles. The colloidal fluid has a saturation magnetization of from greater than 0 to less than about 50 Gauss.

These and other aspects of the invention will become more apparent from the present description and claims.

BRIEF DESCRIPTION OF THE DRAWINGS

For the purpose of illustrating embodiments of the invention, there is shown in the drawings forms which are presently preferred. It should be understood, however, that this invention is not limited to the precise arrangements and instrumentalities shown.

DETAILED DESCRIPTION OF THE INVENTION

Figure 1:
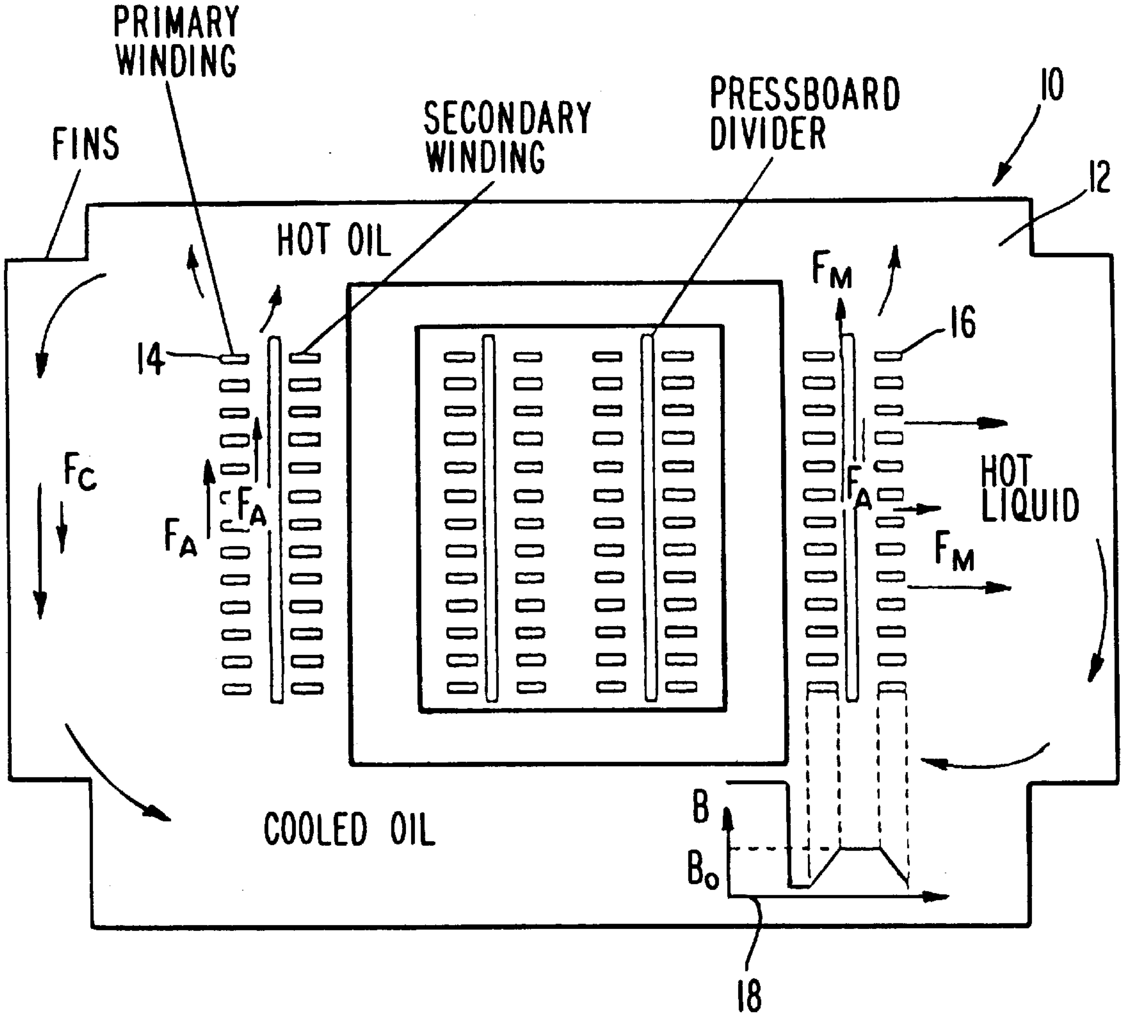
FIG. 1 is a schematic representation of a transformer including a system for cooling the transformer in accordance with an embodiment of the present invention.

The present invention is directed, in part, to novel colloidal fluids for use, for example, in connection with electromagnetic devices. The term "colloid", as used herein, refers to a state of subdivision of matter which may comprise single large molecules, or aggregations of smaller molecules. Within the colloid, particles of ultramicroscopic size, which are often referred to as the dispersed phase, are generally surrounded by different matter, which is often referred to as the carrier liquid, dispersion medium or external phase. The size of the particles included in the colloids of the present invention may vary depending, for example, on the particles employed, the particular application, and the like. Generally speaking, the particle size preferably ranges from about 1 to about 100 nanometers, and all combinations and subcombinations of ranges therein. Thus, the colloids of the present invention may generally be referred to as "nanofluids". In certain embodiments of the present invention, the particles in the colloids may be magnetic. The term "magnetic", as used herein, refers to the property of substances which, under certain conditions, attract or repel each other. An example of a colloid which contains magnetic particles is a "ferrofluid". The ferrofluids described herein may respond to an applied magnetic field as if the fluid itself possessed magnetic characteristics. In certain other preferred embodiments of the present invention, the colloids contain particles which are non-magnetic. The term "non-magnetic", as used herein, refers to the substantial (including complete) lack of magnetic properties.

The colloids of the present invention preferably address the three fundamental problems described above which may limit the power distributed per unit of the device volume (or weight). Specifically, the present colloids are preferably characterized by one or more of the following properties: (a) higher partial discharge voltage which allows for smaller distances between conductive elements of the device in use by increasing the limits in short term AC fluctuations, (b) increased impulse breakdown strength, so that the transformer can be designed with smaller spacings between the charged parts and with improved reliability under high voltage impulse surges, and (c) increased heat transfer capacity proportional to the magnetic field strength, so that heat is efficiently transferred from inside the windings where the magnetic field is the strongest and where efficient heat exchange is most critical.

Generally speaking, the novel colloids of the present invention may be prepared, for example, by combining particles with a carrier fluid. In a preferred method, the colloids may be prepared by combining colloids having a relatively high concentration of particles with a conventional liquid insulation, such as a conventional transformer oil, to provide nanofluids as described herein. Additional methods for preparing the colloids are discussed more fully hereinafter. In preferred embodiments of the present invention, the nanofluids may possess dielectric properties. These dielectric nanofluids may be substantially non-magnetic, or they may possess magnetoactive (magnetic) properties. Exemplary among the dielectric nanofluids of the present invention are ferrofluids. The nanofluids described herein may be formulated to obtain the desired properties depending, for example, on the particular application. For example, the nanofluids may be prepared primarily to enhance the insulation dielectric strength. Increasing the volume concentration of the particles may provide a corresponding increase in the saturation magnetization, resulting in an increase in both the insulation dielectric strength and the heat transfer performance of the nanofluid. The colloids may also be formulated to primarily provide desirable heat transfer.

The effect of ferrofluid magnetization saturation and its electric Resistivity (which are determined by the volume percentage of magnetic particles, their average size and its frequency distribution, as well as some ferrofluid manufacturing specifics) on the magnetoactive liquid dielectric strength at AC and DC voltage conditions and on its cooling capacity have been tested in the laboratory and on commercial transformers. The novel colloidal insulation fluids have been developed in such a way that the partial discharge (PD) inception voltage, heat transfer capacity, and impulse breakdown voltage all correlate with two parameters easy to measure after the magnetoactive colloidal liquid is prepared: the magnetization saturation ($M_S$) which, for the applications described and claimed herein, may be about zero (for non-magnetic colloids), or may vary from about 0.5 to about 50 Gs, and electric Resistivity (R) which may vary from about $10^9$ to more than about $10^{13}$ Ohm-cm. The actual values of these two parameters depend on a particular combination of insulation properties and cooling capacity needed for a given transformer.

Thus, the colloids of the present invention may possess highly advantageous electrical resistivities, and are therefore especially useful as insulating fluids for electromagnetic devices, including transformer devices. In particular, the colloids of the present invention may provide substantial increases in the minimum (positive) values for impulse breakdown voltage, as compared to the minimum (positive) impulse breakdown values associated with many prior art insulating fluids. In preferred embodiments, the present colloids provide an increase in the positive value of impulse breakdown voltage of at least about 10%, with an increase of more than about 10% being more preferred, including, for example, about 15%. Even more preferably, the present colloids provide an increase in the positive value of impulse breakdown voltage of greater than about 15%, for example, about 20%, with an increase of more than 20% being still more preferred, including, for example, about 25%. Yet more preferably, the present colloids provide an increase in the positive value of impulse breakdown voltage of greater than about 25%, for example, about 30%, with an increase of more than 30% being even more preferred, including, for example, about 35%. Still more preferably, the present colloids provide an increase in the positive value of impulse breakdown voltage of greater than about 35%, for example, about 40%, with an increase of more than 40% being still more preferred, including, for example, about 45%. Yet more preferably, the present colloids provide an increase in the positive value of impulse breakdown voltage of greater than about 45%, for example, about 50%, with an increase of more than 50% being still more preferred.

In addition to the aforementioned desirable insulating properties, embodiments of the present invention provide colloids which may possess highly advantageous heat transfer properties. Accordingly, colloids of the present invention may also be utilized, for example, as cooling fluids to cool electromagnetic devices, including high power transformers, which operate at elevated temperatures. As known to the skilled artisan, high power transformers typically operate at temperatures of from about 70° C. to about 90° C., and typically have maximum operating temperatures of about 110° C., with temperatures of up to about 130° C. in so-called hot spots. The temperature increase observed when colloidal insulating fluids of the present invention are utilized as cooling fluids may be substantially less than that observed with many prior art insulating and/or cooling fluids. In preferred embodiments, the temperature rise with colloids of the present invention is preferably reduced by at least about 1%, with a reduction in temperature rise of more than 1% being more preferred, including, for example, about 5%. Even more preferably, the temperature rise with colloids of the present invention is preferably reduced by more than about 5%, including, for example, about 10%, with an increase of more than 10% being still more preferred, including, for example, about 15%.

While not intending to be bound by any theory or theories of operation, it is believed that the desirable cooling properties which are achieved with embodiments of the present invention may be due, at least in part, to an advantageous use of magnetic properties. In this connection, and as discussed more fully hereinafter, the present colloids desirably possess a saturation magnetization of up to about 50 Gauss, (preferably less than about 50 Gauss and, in certain preferred embodiments, from greater than 0 to less than about 50 Gauss). Thus, in the case, for example, of colloids containing magnetic particles, magnetic field gradients which may be formed by electromagnetic devices may attract and draw the colloids towards regions of the device where the magnetic field is strongest such as, for example, the windings. This advantageously enhances the convection cycle which is now driven by two forces: magnetic forces and gravitational forces. However, in certain transformer designs including, for example, transformer designs having pancake windings, the magnetic force produces mainly horizontal convection which is perpendicular to the Archimedes component and which may undesirably interfere with the Archimedes flow of the cooling fluid. This horizontal convection may be reduced by limiting the magnetization saturation of the colloidal fluids. Thus, the magnetization saturation for the colloids of the present invention is desirably selected so as to provide advantageous radial or angular convection inside the coil/core assembly and thereby provide improved cooling effects such as, for example, by preventing the formation of undesirable hot spots. At the same time, in regions outside the coil/core assembly, where magnetic fields decrease sharply, the Archimedes convection may prevail, thereby preserving the trajectory of normal (i.e., vertical) liquid circulation.

The colloids of the present invention are preferably highly stable. The term “stable”, as used herein, means that the present colloids are substantially or completely resistant to decomposition, including, for example, chemical degradation of the dispersed and/or carrier phase, as well as phase separation of the dispersed and carrier phases, when exposed to varying temperature conditions, including elevated temperatures which may be associated with the operation of electromagnetic devices, such as power transformers, preferably for extended periods of time. Thus, the present colloids are particularly suitable for use, for example, as insulating fluids for electromagnetic devices, including power transformers, which may have extremely long life spans. In preferred form, the colloids of the present invention preferably possess electrical resistivities of at least about $10^9$ ohm·cm, with electrical resistivities of greater than about $10^9$ ohm·cm being more preferred. Even more preferably, the colloids of the present invention possess electrical resistivities of from about $10^9$ ohm·cm to more than about $10^{13}$ ohm·cm. As discussed above, the present colloids also possess highly beneficial heat transfer properties. Accordingly, the colloids described herein may be advantageously employed as cooling agents for electromagnetic devices, including electromagnetic devices which operate at high power levels and which may produce significantly elevated operating temperatures, such as power transformers.

A wide variety of materials may be employed in the present colloids, for example, as the dispersed and/or carrier phases. The particular materials which are utilized may vary and depends, for example, on the desired levels of magnetization, cooling properties, electrical resistivity, and the like, as well as the desired application. In preferred form, the dispersed and carrier phases are selected so that the colloids of the present invention have a saturation magnetization (Ms) of no greater than about 50 Gauss and preferably, less than about 50 Gauss including, for example, from about 0 to less than about 50 Gauss, and all combinations and subcombinations of ranges therein. In the case of colloids prepared from non-magnetic particles, the colloids may have a saturation magnetization of about 0. In the case of colloids prepared from particles having magnetic properties, the colloids may have a saturation magnetization of from greater than 0 to less than about 50 Gauss. It has been observed that especially advantageous cooling effects may be observed with colloids having a saturation magnetization of from about 0.5 to less than about 50 Gauss, with optimum cooling being observed with saturation magnetizations of from about 20 to about 40 Gauss. Particularly advantageous dielectric strengths are observed when the colloids of the present invention possess a saturation magnetization of from about 0.1 to about 5 Gauss, with optimum dielectric strengths being observed with saturation magnetizations of from about 0.5 to about 2 Gauss. For both desirable cooling and dielectric properties, the colloids of the present invention preferably have saturation magnetizations of from about 1 to about 20 Gauss, with about 5 to about 20 Gauss providing optimum combined properties.

In accordance with preferred embodiments of the present invention, the carrier phase is preferably a liquid which itself is stable, and which provides a desirable and stable environment for the dispersed phase. It is also preferred that the carrier phase possess a low dielectric constant, preferably less than about 3. It is also preferred that the carrier liquid possess a high electrical resistivity level which may enhance the electrical resistivity of the present colloids, as discussed above. The viscosity of the carrier phase may be selected, as desired, to provide desirable stability of the present colloids, as well as advantageous convection cooling, as described herein.

In preferred embodiments, the carrier phase employed in the present colloids is an oil. Exemplary oils include, for example, many of the oils which are currently employed as cooling fluids in high-power transformers. Thus, exemplary oils include, for example, various forms of petroleum, including those of high molecular weight, synthetic hydrocarbons, and silicones. Oils which are particularly suitable for use as the carrier phase in the present colloids are transformer grade mineral oils which are sold under the trade name UNIVOLT™, commercially available from Exxon Corporation (St. Paul, Minn.). Other materials which may be suitable for use as the carrier phase in the colloids described herein would be readily apparent to one of ordinary skill in the art, once armed with the present disclosure.

As noted above, the present colloidal fluids further preferably comprise a dispersed phase, preferably in the form of particles. As with the carrier phase discussed above, a wide variety of materials may be employed as the dispersed phase in the colloids described herein. In preferred embodiments, the dispersed phase is derived from nonmetallic materials. Specifically, it has been observed that improved AC breakdown strengths may be provided when the dispersed phase comprises a non-metallic material. The term "non-metallic", as used herein, refers to materials which may be substantially or completely devoid of metallic properties and/or characteristics. Exemplary non-metallic materials which may be employed as the dispersed phase include, for example, organic materials (such as, for example, polymeric materials), inorganic materials (such as, for example, aerosil), and certain elements, such as elemental carbon. Preferred among these exemplary non-metallic materials are inorganic materials, with metal oxides being particularly preferred among the inorganic materials.

In accordance with certain preferred embodiments of the present invention, the dispersed phase is derived from materials which are magnetic (that is, materials which have an intrinsic magnetic dipole moment), with materials that are both magnetic and non-metallic being preferred. This is because it has been found that both improved AC breakdown strengths and advantageous cooling properties may be obtained when the dispersed phase is both non-metallic and magnetic. It is also preferred that the dispersed phase comprise materials having a Curie temperature of greater than about 200° C. In particularly preferred embodiments, the dispersed phase comprises a magnetic inorganic material, with magnetic metal oxides being yet more preferred. Preferred among these metal oxides are, for example, oxides of iron (such as, for example, FeO, $Fe_2O_3$ and $Fe_3O_4$), zinc (such as, for example ZnO), cobalt (such as, for example, CoO), manganese (such as, for example, MnO, $Mn_3O_4$ and $Mn_2O_3$), titanium (such as, for example, $TiO_2$ and $Ti_2O_3$), copper (such as, for example, $Cu_2O$), nickel (such as, for example, NiO and $Ni_2O_3$), and chromium (such as, for example, $Cr_2O_3$). Preferred also are mixed metal oxides including, for example, oxides of iron and cobalt (such as, for example, $Fe_2CoO_4$), iron, manganese and zinc (such as, for example, $Mn_xZn_{(1-x)}Fe_2O_4$, where x may range from about 0.4 to about 0.8), and iron, cobalt and zinc (such as, for example, $Co_xZn_{(1-x)}Fe_2O_4$, where x may range from about 0.2 to about 0.6). Particularly preferred among the metal oxides are iron oxides. Also in preferred form, the oxides employed have reasonably high magnetization levels which are also substantially dependent on temperature. Viewed from this standpoint, $Mn_xZn_{(1-x)}$ oxides and iron oxides are most preferred, wherein $Mn_xZn_{(1-x)}$ oxides are particularly suitable for use under the most demanding conditions (such as, for example, in traction transformers), and iron oxides are particularly suitable for use in conventional distribution and power transformers.

In certain other preferred embodiments of the invention, the dispersed phase may be derived from materials which are non-magnetic. Preferred non-magnetic materials include, for example, organic materials, such as a polymeric material and non-organic aerosils. Preferred among the polymeric materials are fluorinated polymers, including, for example, poly(tetrafluoroethylene), which is commercially available from the DuPont Chemical Co. (Wilmington, Del.) as TEFLON™.

Other materials which may be suitable for use as the dispersed phase in the colloids described herein would be readily apparent to one of ordinary skill in the art, once armed with the present disclosure.

The material which may be utilized as the dispersed phase in the colloids of the present invention is preferably in the form of particles. The size of the particles which are dispersed in the colloid may vary and depends, for example, on the particular dispersed and carrier phases utilized, and the desired application. It is preferred, however, that the size of the particles be selected from among a preferred particle size range. In this connection, it has been found that particle size may affect the cooling and electrical resistivity properties of the colloid. For example, depending on the chemical components of the particles, the use of smaller particles may result in colloids having lower electric resistivity properties which, in use, may result in undesirably high dielectric losses. Conversely, the use of larger particles may, depending on the chemical components of the particles, result in colloids which have poor stability properties, particularly at elevated temperatures. As noted above, preferred particle sizes range from about 1 to about 100 nanometers (nm), and all combinations and subcombinations of ranges therein. More preferably, the average particle size may range from about 5 nm up to about 20 nm, with an average particle size of greater than about 5 nm to less than about 20 nm being even more preferred, including, for example, about 15 nm. Still more preferably, the average particle size may be at least about 7 nm, with about 90% of the particles having a particle size of greater than about 7 nm being particularly preferred.

The concentration of the dispersed phase in the colloids of the present invention liquid may vary and depends, for example, on the particular dispersed and carrier phases utilized, the desired application of the colloid, and the like. If desired, the colloid may be formed initially with the dispersed phase being present in higher concentrations. These concentrated colloids may then be diluted, for example, to achieve a preferred concentration, as discussed more fully hereinafter. In this manner, the colloids of the present invention may provide beneficial versatility, since concentrations may be obtained by the end-user, as desired, depending on the particular application. In this connection, it is contemplated that the dilution may be conducted, for example, at the site of the intended use, such as the manufacturing and/or utility site of a power transformer. The initial preparation of colloids in concentrated form may serve to reduce the volume of the colloid which needs to be shipped to the desired site. This may facilitate transportation of the colloid, for example, by reducing the necessity and/or frequency of shipments of colloid to the site, which may provide significant cost savings.

Broadly speaking, the dispersed phase may be included in the present colloids in a concentration which preferably ranges from greater than about 0% by volume, such as, for example, about 0.01% by volume, up to about 2% by volume, and all combinations and subcombinations of ranges therein. In connection with colloids prepared from dispersed phases which are composed of non-magnetic particles, the concentration of the dispersed phase is preferably from about 0.01% by volume to about 0.5% by volume, with a concentration of from about 0.05% to about 0.3% by volume being more preferred. In connection with colloids prepared from dispersed phases which are composed of magnetic particles, the concentration of the dispersed phase is preferably from about 0.01% by volume to less than 2% by volume, with concentrations of from about 0.02% to about 1% by volume being more preferred.

As would be apparent to one of ordinary skill in the art, once armed with the present disclosure, the amount of carrier phase employed in the colloids described herein may vary and depends, for example, on the concentration of dispersed phase employed, as discussed above. Thus, generally speaking, the amount of carrier liquid may preferably range from about 99.99% by volume to less than about 98% by volume, including all combinations and subcombinations of ranges therein. In connection with colloids prepared from dispersed phases which are composed of non-magnetic particles, the carrier liquid is preferably present in an amount from about 99.99% by volume to about 99.5% by volume, with a concentration of from about 99.95% to about 99.7% by volume being more preferred. In connection with colloids prepared from dispersed phases which are composed of magnetic particles, the carrier phase is preferably present in an amount of from about 99.99% by volume to greater than about 99.8% by volume, with concentrations of from about 99.98% to about 99% by volume being more preferred.

In addition to the dispersed phase and carrier phase discussed above, the colloids of the present invention may further optionally comprise additional additive materials, including, for example, stabilizing materials, such as, for example, surfactants, dispersants, thickening agents, viscosity modifying agents, antioxidants, and the like. Such materials may be employed, for example, to enhance the stability of the colloids by minimizing or substantially (including completely) preventing phase separation, agglomeration of the dispersed phase, and the like. In preferred embodiments, the optional additive material comprises a surfactant. Preferably, the surfactant contacts or substantially (including completely) coats the particles in the colloid. In the case of particles which are non-magnetic, the particles may be silanized.

A wide variety of surfactants are may be employed in the present colloids. The surfactant may be anionic, cationic or non-ionic, depending, for example, on the particular dispersed and carrier phases employed, and the desired application. Exemplary anionic surfactants include, for example, long-chain (fatty) compounds which contain carboxy groups, succinate groups, phosphate groups, or sulfonate groups. Exemplary cationic surfactants include, for example, long-chain compounds which contain protonated or quaternary ammonium groups. Exemplary non-ionic surfactants include, for example, alcohols and polyoxyalkylene polymers. Other surfactants, in addition to those exemplified above, as well as other optional additive materials suitable for use in the present colloids, would be readily apparent to one of ordinary skill in the art, once armed with the present disclosure.

The concentration of optional additive materials which may be employed in the present colloids may vary and depends, for example, on the particular additive material, dispersed phase and/or carrier phase employed. Preferably, the additional additive material may be employed in a concentration which enhances desirable characteristics of the colloids, such as, for example, stability, cooling, antioxidizing, and/or insulating properties. In preferred embodiments, the optional additive material may be employed in a concentration of from about 0.02% by volume to about 1% by volume, and all combinations and subcombinations of ranges therein.

The colloids of the present invention may be prepared using techniques which would be apparent to the skilled artisan, once placed in possession of the present disclosure. For example, colloidal dispersions of particles may be prepared by utilizing methods such as, for example, grinding coarse particles, such as by ball-milling, in the presence of a liquid carrier. The particles resulting from the grinding process may, if desired, be removed from the carrier and then redispersed in a second carrier. Removal of the particles may involve, for example, flocculation. Methods for preparing colloids, including ferrofluids, which may be employed to prepare the colloids of the present invention, are described, for example, in Papell, U.S. Pat. No. 3,215,572, Rosenswieg, U.S. Pat. No. 3,917,538, and *Magnetic Fluids and Applications Handbook*, B. Berkovsky, V. Bashtovoy, Eds., Begall Publishing House, New York, N.Y. (1996), the disclosures of which are hereby incorporated herein by reference, in their entireties.

EXAMPLES

The invention is further described in the following examples. The examples are actual examples and are for illustrative purposes only, and are not to be construed as limiting the appended claims.

Example 1

This example includes a description of experiments which were conducted to evaluate the effect on stability, dielectric strength and dissipation factor of varying concentrations of particles in a transformer oil. The results of these experiments are tabulated in the following Table 1. The compositions studied in these experiments were formulated from UNIVOLT™ 60 oil, which is a transformer grade mineral oil commercially available from Exxon Corporation (St. Paul, Minn.), iron oxide ($Fe_3O_4$) particles as magnetic particles, TEFLON™ particles as non-magnetic particles, and oleic acid as surfactant. The testing methods employed in this example were conducted according to ASTM standards. Impulse breakdown voltage was evaluated according to ASTM D-3300.

TABLE 1

| | | | | Characteristic Measured | | | | | | |
|---|---|---|---|---|---|---|---|---|---|---|
| | Particle | | | Dielectric Strength (KV) | | | Dissipation Factor | | | |
| | Conc. | | Ms | AC | Impulse Breakdown | | (tan δ) | | Loss Increase | |
| Example | (Volume %) | Particle Type | Gauss) | Breakdown | Positive | Negative | at 25° C. | at 100° C. | (% of Total) | Stability |
| 1A | 0 | — | 0 | 55 | 78 | 151 | 0.005 | 0.04 | 0 | — |
| 1B | 5 | magnetic | 250 | 46 | 85 | 135 | >1000 | >1000 | 25 | stable |
| 1C | 5 | non-magnetic | 0 | 52 | n/a | n/a | n/a | n/a | n/a | unstable |
| 1D | 2 | magnetic | 100 | 47 | 89 | 120 | 150 | >1000 | 8 | stable |
| 1E | 2 | non-magnetic | 0 | 53 | 95 | 140 | 1.5 | 6 | n/a | unstable |
| 1F | 1 | magnetic | 50 | 49 | 105 | 110 | 12 | 95 | 5 | stable |
| 1G | 1 | non-magnetic | 0 | 55 | 110 | 120 | 0.6 | 3.5 | 0.2 | stable |

TABLE 1-continued

| | | | | Characteristic Measured | | | | | | |
|---|---|---|---|---|---|---|---|---|---|---|
| | Particle | | | Dielectric Strength (KV) | | | Dissipation Factor | | | |
| | Conc. | | Ms | AC | Impulse Breakdown | | (tan δ) | | Loss Increase | |
| Example | (Volume %) | Particle Type | Gauss) | Breakdown | Positive | Negative | at 25° C. | at 100° C. | (% of Total) | Stability |
| 1H | 0.6 | magnetic | 30 | 54 | 120 | 125 | 1.5 | 8 | 1 | stable |
| 1I | 0.6 | non-magnetic | 0 | 55 | 110 | 120 | 0.4 | 2.5 | 0.1 | stable |
| 1J | 0.1 | magnetic | 5 | 54 | 120 | 120 | 1.2 | 4.5 | 0.4 | stable |
| 1K | 0.1 | non-magnetic | 0 | 55 | 125 | 120 | 0.06 | 0.3 | 0 | stable |
| 1L | 0.01 | magnetic | 0.5 | 55 | 115 | 125 | 0.1 | 0.4 | 0.1 | stable |
| 1M | 0.01 | non-magnetic | 0 | 55 | 115 | 125 | 0.009 | 0.05 | 0 | stable |

Note:
Ms is saturation magnetization

Inspection of the data in Table 1 reveals that colloids within the scope of the present invention (as exemplified, for example, by Examples 1E and 1G through 1M), which may comprise a dispersed phase concentration of up to about 2% by volume and a saturation magnetization (Ms) of less than about 50 Gauss, exhibit significantly improved dielectric strengths as compared to colloidal fluids of the prior art which include dispersed phase concentrations of greater than about 2% by volume and an Ms of about 50 Gauss or greater (see Examples 1B through 1D and 1F) and pure oil (see Example 1A). Specifically, colloids within the scope of the present invention possess increased positive values for the impulse breakdown strength as compared to colloids of the prior art. The data reveals also that colloids within the scope of the present invention possess improved dissipation factors at both ambient temperature (25° C.) and at elevated temperature (100° C.).

Example 2

This example includes a description of experiments which were conducted to evaluate and compare the cooling performance of colloidal fluids within the scope of the present invention to the cooling performance of colloidal fluids of the prior art.

Colloidal fluids having saturation magnetization values of 1, 5, 10, 30, 50 and200 Gauss were prepared by making various dilutions in oil of a colloid of magnetite ($FeO{\cdot}Fe_2O_3$). These colloidal fluids were utilized as insulation fluids for a 50 KVA transformer operating at a temperature of about 70° C. A cooling fluid containing oil only (Example 2A) was run as a control. Temperature readings were taken at different locations (top, middle, bottom) around the transformer windings and cooling fins. The resulting data is tabulated below.

TABLE 2

| | | Zone Where Temperature Rise Was Measured | | | | | | | |
|---|---|---|---|---|---|---|---|---|---|
| | Ms | Windings | | | | Cooling Fins | | | |
| Example | (Gauss) | Top | Middle | Bottom | Average | Top | Middle | Bottom | Average |
| 2A | 0 | 71.3 | 67.6 | 53.6 | 64.2 | 56.1 | 54.2 | 39.5 | 49.9 |
| 2B | 200 | 75.1 | 65.5 | 56 | 65.5 | 48.3 | 53.5 | 38 | 46.6 |
| 2C | 50 | 74.7 | 66.3 | 54.7 | 65.2 | 51.2 | 52.4 | 38.5 | 47.4 |
| 2D | 30 | 63.5 | 64 | 51.5 | 59.7 | 54.2 | 53 | 39 | 48.7 |
| 2E | 10 | 66.2 | 65.1 | 52.7 | 61.3 | 55.5 | 53.3 | 39.1 | 49.3 |
| 2F | 5 | 67 | 65.5 | 53 | 61.8 | 56 | 54 | 39.2 | 49.7 |
| 2G | 1 | 71 | 67.5 | 53.5 | 64 | 56 | 54 | 39.6 | 49.9 |

Notes:
1. Transformer was loaded at 110%: Voltage = 200 V; Current = 275 A.

Inspection of the data in Table 2 reveals that colloidal fluids of the present invention, which are exemplified as Examples 2D, 2E, 2F and 2G and which have magnetization saturations of less than about 50 Gauss, provide improved cooling at various locations around the transformer, as compared to the cooling provided by prior art cooling fluids which are exemplified by Examples 2B and 2C, which have saturation magnetizations of about 50 Gauss or greater, and Example 2A, which is pure oil. In particular, the temperature gradient between the top and bottom of the transformer windings is less pronounced with cooling fluids of the present invention, as compared to the corresponding temperature gradient encountered with cooling fluids of the prior art. This indicates that cooling fluids of the present invention exhibit increased circulation around the entire transformer.

The cooling of a transformer with the colloidal fluids of the present invention is depicted schematically in FIGS. 1A and 1B. With particular reference to FIG. 1A, there is shown a schematic drawing of a transformer 10, depicting the flow of a colloidal fluid 12 within the transformer 10, and particularly around left windings 14 and right windings 16. Representative of the flow of colloidal fluid 12 is vector $F_A$ which indicates the upwards Archimedes force acting on the heated colloidal fluid 12 and vector $F_C$ which indicates the downwards component of the Archimedes force acting on cooled portions of the colloidal fluid 12. Vector $F_A$ is substantially identical with the colloidal fluids of the present invention as with conventional oils of the prior art which may be used as the carrier oil in the present colloidal fluids. Vector $F_M$ is the force due to the magnetic interaction of the colloidal fluid 12 with the magnetic field created by windings 16.

The Descartes axes 18 shows the magnetic field density of across the windings 16. $B_O$ is the magnetic induction between the windings, and B is the magnetic induction inside the magnetic core. This magnetic field gradient results in a pressure drop across the windings 16 and results in magnetohydronamic convection.

Example 3

Experiments were conducted to evaluate the effect of particle size on the electrical resistivity and dielectric strength of colloidal cooling fluids within the scope of the present invention. The results of these experiments are tabulated in Table 3 below.

TABLE 3

| Magnetization Saturation | Resistivity ($10^{10}$ Ohm · cm) For Varying Particle Size (nm) | | | Loss Increase (% of total) For Varying Particle Size (nm) | | |
|---|---|---|---|---|---|---|
| (Gauss) | <7 | 9 | >10 | <7 | 9 | >10 |
| 30 | 1.5 | 5 | 12 | 6 | 1.0 | 0.7 |
| 10 | 4 | 12 | 30 | 2.8 | 0.5 | 0.3 |
| 5 | 7 | 20 | 50 | 1.5 | 0.2 | 0.1 |

Inspection of the data set forth in Table 3 indicates that increasing the average particle size from less than about 7 nm to greater than about 10 nm results in about a ten-fold increase in electric Resistivity as well as about a ten-fold decrease in power loss associated with the conductive component of dielectric loss.

The disclosures of each patent, patent application and publication cited or described in this document are hereby incorporated by reference, in their entirety.

Various modifications of the invention, in addition to those described herein, will be apparent to those skilled in the art from the foregoing description. Such modifications are also intended to fall within the scope of the appended claims.

What is claimed is:

1. A stable colloidal fluid comprising:

(a) about 99.99 to about 99.5% by volume of a carrier liquid; and (b) from about 0.01 to about 0.5% by volume of non-metallic particles, wherein the colloidal fluid has a saturation magnetization of from about 1 to about 20 Gauss, and wherein said particles are magnetic particles.

2. A colloidal fluid according to claim 1 which has an electrical resistivity of at least about $10^9$ ohm·cm.

3. A colloidal fluid according to claim 2 which has an electrical resistivity of from about $10^9$ ohm·cm to about $10^{13}$ ohm·cm.

4. A colloidal fluid according to claim 3 which has an electrical resistivity of greater than about $10^{13}$ ohm·cm.

5. A colloidal fluid according to claim 1 wherein said carrier liquid comprises an oil.

6. A colloidal fluid according to claim 1 wherein said particles comprise inorganic particles.

7. A colloidal fluid according to claim 6 wherein said particles are selected from the group consisting of metal oxides.

8. A colloidal fluid according to claim 7 wherein said particles comprise oxides of metals selected from the group consisting of iron, zinc, manganese, titanium, copper, nickel, chromium, and combinations thereof.

9. A colloidal fluid according to claim 1 which further comprises a stabilizing material.

10. A colloidal fluid according to claim 9 wherein said stabilizing material comprises a surfactant.

11. A colloidal fluid according to claim 1 which has a saturation magnetization of from about 5 to about 20 Gauss.

12. A colloidal fluid according to claim 1 wherein the size of said particles ranges from about 1 to about 100 nm.

13. A colloidal fluid according to claim 12 wherein said particles have an average particle size of from about 5 to about 20 nm.

14. A colloidal fluid according to claim 13 wherein said particles have an average particle size of from about 7 to about 20 nm.

15. A colloidal fluid according to claim 1 which provides an increase in the positive value of impulse breakdown voltage of at least about 10%.

16. A method for preparing a stable colloidal fluid having a saturation magnetization of from about 1 to about 20 Gauss, wherein the method comprises:

(a) providing about 99.99 to about 99.5% by volume of a carrier liquid; and (b) combining from about 0.01 to about 0.5% by volume of non-metallic particles with said carrier liquid, wherein said particles are magnetic particles.

17. A method according to claim 16 wherein said carrier liquid comprises an oil.

18. A method according to claims 16 wherein said particles comprise inorganic particles.

19. A method according to claim 16 wherein said colloidal fluid has an electrical resistivity of greater than about $10^9$ ohm·cm.

20. An electromagnetic device comprising:

(a) means for producing an electromagnetic field and heat; and (b) a stable, colloidal insulating fluid which is in contact with said device and which comprises:

(i) a carrier liquid; and (ii) non-metallic particles;

wherein the colloidal insulating fluid has a saturation magnetization of from about 1 to about 20 Gauss.

21. An electromagnetic device according to claim 20 which is a power transformer.

22. A method of insulating and cooling an electromagnetic device which produces an external magnetic field and heat, wherein the method comprises contacting the device with a stable, colloidal insulating fluid comprising:

(a) a carrier liquid; and (b) non-metallic particles;

wherein the colloidal insulating fluid has a saturation magnetization of from about 1 to about 20 Gauss.

23. A stable colloidal fluid comprising:

(a) about 99.99 to about 99.5% by volume of a carrier liquid; and (b) from about 0.01 to about 0.5% by volume of non-metallic particles, wherein the colloidal fluid has a saturation magnetization of from about 0 to about 25 Gauss, and wherein said particles are magnetic particles.

24. A colloidal fluid according to claim 23 which has a saturation magnetization of from about 0.5 to less than about 5 Gauss.

25. A colloidal fluid according to claim 23 which has a saturation magnetization of from about 10 to about 25 Gauss.

* * * * *